(12) United States Patent
Chen et al.

(10) Patent No.: US 10,700,297 B2
(45) Date of Patent: Jun. 30, 2020

(54) DISPLAY DEVICE AND ORGANIC THIN FILM TRANSISTOR INCLUDING SEMICONDUCTOR LAYER HAVING L-SHAPED CROSS-SECTION

(71) Applicant: E Ink Holdings Inc., Hsinchu (TW)

(72) Inventors: Po-Wei Chen, Hsinchu (TW); Wen-Chung Tang, Hsinchu (TW); Yu-Lin Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 328 days.

(21) Appl. No.: 15/814,416

(22) Filed: Nov. 16, 2017

(65) Prior Publication Data
US 2018/0233683 A1    Aug. 16, 2018

(30) Foreign Application Priority Data
Feb. 14, 2017 (CN) .......................... 2017 1 0077375

(51) Int. Cl.
*H01L 51/05* (2006.01)
*H01L 27/28* (2006.01)
(Continued)

(52) U.S. Cl.
CPC ........ *H01L 51/0558* (2013.01); *H01L 27/283* (2013.01); *H01L 51/057* (2013.01);
(Continued)

(58) Field of Classification Search
CPC .............. H01L 51/0558; H01L 51/0516; H01L 51/057; H01L 27/283
See application file for complete search history.

(56) References Cited

U.S. PATENT DOCUMENTS 7,238,554 B2   7/2007 Schuele et al.
7,560,347 B2   7/2009 Furukawa et al.
(Continued)

FOREIGN PATENT DOCUMENTS

JP   2009205897 A    9/2009
JP   2012212522 A   11/2012
(Continued)

OTHER PUBLICATIONS

Corresponding Taiwanese Notice of Allowance dated Sep. 15, 2017.

*Primary Examiner* — Matthew E. Gordon
(74) *Attorney, Agent, or Firm* — CKC & Partners Co., LLC

(57) ABSTRACT

An organic thin film transistor includes a drain electrode, a semiconductor layer, a source electrode, a gate insulator, and a gate electrode. A horizontal portion and a vertical portion of the semiconductor layer are respectively located on a top surface and an end surface of the drain electrode, and the drain electrode protrudes from the horizontal portion in a first direction. The source electrode is disposed along a surface of the semiconductor layer. The source electrode has an extending portion that extends in a second direction opposite to the first direction. The gate insulator is disposed along a top surface and two side surfaces of a stacked structure defined by the drain electrode, the semiconductor layer, and the source electrode. The gate electrode is located on the gate insulator, and a portion of the gate insulator is between the stacked structure and the gate electrode.

19 Claims, 3 Drawing Sheets

(51) Int. Cl.
 *G02F 1/167* (2019.01)
 *G02F 1/1362* (2006.01)
(52) U.S. Cl.
 CPC ........ *H01L 51/0516* (2013.01); *G02F 1/1362* (2013.01); *G02F 1/167* (2013.01)

(56) References Cited

U.S. PATENT DOCUMENTS

| | | |
|---|---|---|
| 7,564,084 B2 | 7/2009 | Song et al. |
| 7,588,971 B2 | 9/2009 | Wang et al. |
| 7,773,166 B2 | 8/2010 | Choi et al. |
| 7,786,522 B2 | 8/2010 | Manning et al. |
| 7,947,986 B2 | 5/2011 | Song et al. |
| 8,208,086 B2 | 6/2012 | Choi et al. |
| 9,401,430 B1 | 7/2016 | Ellinger et al. |
| 2009/0072226 A1 | 3/2009 | Koo et al. |
| 2010/0133539 A1* | 6/2010 | Kang ...................... H01L 27/12 257/59 |
| 2012/0211737 A1* | 8/2012 | Maekawa ........... H01L 51/0018 257/40 |
| 2016/0027890 A1* | 1/2016 | Hahn ...................... H01L 29/45 257/66 |
| 2017/0222166 A1* | 8/2017 | Kleemann ........... H01L 51/0016 |

FOREIGN PATENT DOCUMENTS

| | | |
|---|---|---|
| TW | I278048 B | 4/2007 |
| TW | I515937 B | 1/2016 |
| TW | I525833 B | 3/2016 |

\* cited by examiner

DISPLAY DEVICE AND ORGANIC THIN FILM TRANSISTOR INCLUDING SEMICONDUCTOR LAYER HAVING L-SHAPED CROSS-SECTION

RELATED APPLICATIONS

This application claims priority to China Application Serial Number 201710077375.1, Feb. 14, 2017, which is herein incorporated by reference.

BACKGROUND

Field of Invention

The present invention relates to an organic thin film transistor and a display device having the organic thin film transistor.

Description of Related Art

In conventional organic thin film transistor technologies, a dielectric constant of an organic insulating layer is not large enough to achieve an objective of ideal charging, and thus the size of the organic thin film transistor has to be designed to be relatively large. As a result, the conventional organic thin film transistor technologies have a certain level of difficulty on product applications and designs, especially on high resolution products.

There are two types of organic thin film transistors including a single gate structure and a dual gate structure. The organic thin film transistor with the single gate structure has poorer stability. However, in manufacturing aspect, compared with the single gate structure, the fabrication of the organic thin film transistor with the dual gate structure needs plural lithography processes and plural etching processes of contact holes, and thus is more complicated and requires longer tact time.

SUMMARY

An aspect of the present invention is to provide an organic thin film transistor.

According to an embodiment of the present invention, an organic thin film transistor includes a drain electrode, a semiconductor layer, a source electrode, a gate insulator, and a gate electrode. The drain electrode has a top surface and an end surface that is adjacent to the top surface. The semiconductor layer has a horizontal portion and a vertical portion that is adjacent to the horizontal portion. The horizontal portion and the vertical portion are respectively located on the top surface and the end surface of the drain electrode. The drain electrode protrudes from the horizontal portion of the semiconductor layer in a first direction that is away from the vertical portion of the semiconductor layer. The source electrode is disposed along a surface of the semiconductor layer facing away from the drain electrode, and has an extending portion that extends in a second direction opposite to the first direction. The drain electrode, the semiconductor layer, and the source electrode define a stacked structure that has a top surface and two opposite side surfaces. The gate insulator covers the stacked structure, and at least one portion of the gate insulator is disposed along the top surface and the two side surfaces of the stacked structure. The gate electrode is located on the gate insulator, such that a portion of the gate insulator is located between the stacked structure and the gate electrode.

In one embodiment of the present invention, the semiconductor layer has an L-shaped cross section.

In one embodiment of the present invention, the source electrode has a first portion, a second portion, and the extending portion that are sequentially connected, in which the first portion is located on the horizontal portion of the semiconductor layer, and the second portion is located on the vertical portion of the semiconductor layer.

In one embodiment of the present invention, the first portion is substantially parallel to the extending portion, and the second portion is substantially perpendicular to the first portion and the extending portion.

In one embodiment of the present invention, the horizontal portion of the semiconductor layer has an end surface, and the end surface of the horizontal portion is coplanar with an end surface of the first portion of the source electrode.

In one embodiment of the present invention, the horizontal portion of the semiconductor layer is located between the first portion of the source electrode and the drain electrode.

In one embodiment of the present invention, the gate insulator has a top portion and two opposite sidewalls, in which the top portion of the gate insulator is located between the gate electrode and the first portion of the source electrode, and the stacked structure is located between the two sidewalls of the gate insulator.

In one embodiment of the present invention, the first portion of the source electrode overlaps at least one portion of the drain electrode.

In one embodiment of the present invention, the source electrode has a stepped cross section.

In one embodiment of the present invention, the gate insulator has a U-shaped cross section.

In one embodiment of the present invention, the horizontal portion of the semiconductor layer has an end surface that faces away from the vertical portion, and a thickness of the horizontal portion of the semiconductor layer is smaller than a distance between the end surface of the horizontal portion and the vertical portion.

In one embodiment of the present invention, the thickness of the horizontal portion is in a range from 10 nm to 100 nm.

In one embodiment of the present invention, two opposite sides of the semiconductor layer are respectively in contact with the drain electrode and the source electrode, and another two opposite sides of the semiconductor layer are in contact with the gate insulator.

Another aspect of the present invention is to provide a display device.

According to an embodiment of the present invention, a display device includes a substrate, at least one organic thin film transistor, at least one pixel electrode, and a front panel laminate. The organic thin film transistor is located on the substrate and includes a drain electrode, a semiconductor layer, a source electrode, a gate insulator, and a gate electrode. The drain electrode is located on the substrate and has a top surface and an end surface that is adjacent to the top surface. The semiconductor layer is located on the substrate and has a horizontal portion and a vertical portion that is adjacent to the horizontal portion. The horizontal portion and the vertical portion are respectively located on the top surface and the end surface of the drain electrode, and the drain electrode protrudes from the horizontal portion of the semiconductor layer in a first direction that is away from the vertical portion of the semiconductor layer. The source electrode is located on the substrate and disposed along a surface of the semiconductor layer facing away from the drain electrode, and has an extending portion that extends in a second direction opposite to the first direction. The drain electrode, the semiconductor layer, and the source electrode define a stacked structure that has a top surface and two opposite side surfaces. The gate insulator covers the stacked structure, and at least one portion of the gate insulator is disposed along the top surface and the two side surfaces of the stacked structure. The gate electrode is located on the gate insulator, such that a portion of the gate insulator is located between the stacked structure and the gate electrode. The pixel electrode is electrically connected to the source electrode of the organic thin film transistor. The front panel laminate is located on the pixel electrode and has a light transmissive sheet and a display medium layer. The display medium layer is located between the light transmissive sheet and the pixel electrode.

In one embodiment of the present invention, the gate insulator has a first conductive channel electrically connected to the source electrode, and the display device further includes a conductive layer. The conductive layer is located on the gate insulator and is electrically connected to the first conductive channel.

In one embodiment of the present invention, the display device further includes a passivation layer. The passivation layer covers the organic thin film transistor and the conductive layer.

In one embodiment of the present invention, the pixel electrode is located on the passivation layer, and the passivation layer has a second conductive channel electrically connected to pixel electrode and the conductive layer.

In one embodiment of the present invention, the second conductive channel is aligned with the first conductive channel.

In one embodiment of the present invention, the display medium layer has microcapsules, and the front panel laminate further includes a common electrode. The common electrode is located on the light transmissive sheet and is opposite the pixel electrode. The microcapsules are located between the common electrode and the pixel electrode.

In the aforementioned embodiments of the present invention, since the combination of the drain electrode, the semiconductor layer, and the source electrode is the stacked structure, and the gate electrode is disposed on the gate insulator that is on the top surface and the two side surfaces of the stacked structure, the organic thin film transistor may be referred to as a dual gate structure. In the organic thin film transistor, the thickness of the semiconductor layer is the length of a channel, and hence the current of the organic thin film transistor can be improved as long as the source electrode partially overlaps the drain electrode. As a result, the space of a pixel area occupied by the organic thin film transistor may be reduced, capacitance may be increased, and parasitic capacitance may be reduced, thereby increasing the display area of the pixel area. The organic thin film transistor with the dual gate structure may prevent ions in a front channel and a back channel from diffusing into the channel, such that the instability caused by the ion diffusion can be overcome. Moreover, the gate electrode of the organic thin film transistor is manufactured by only one lithography process, and is not involved in the manufacturing processes of contact holes that are complicated and cause the source electrode and the drain electrode to be easily oxidized, thereby reducing the complexity of research and production, and the tact time.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
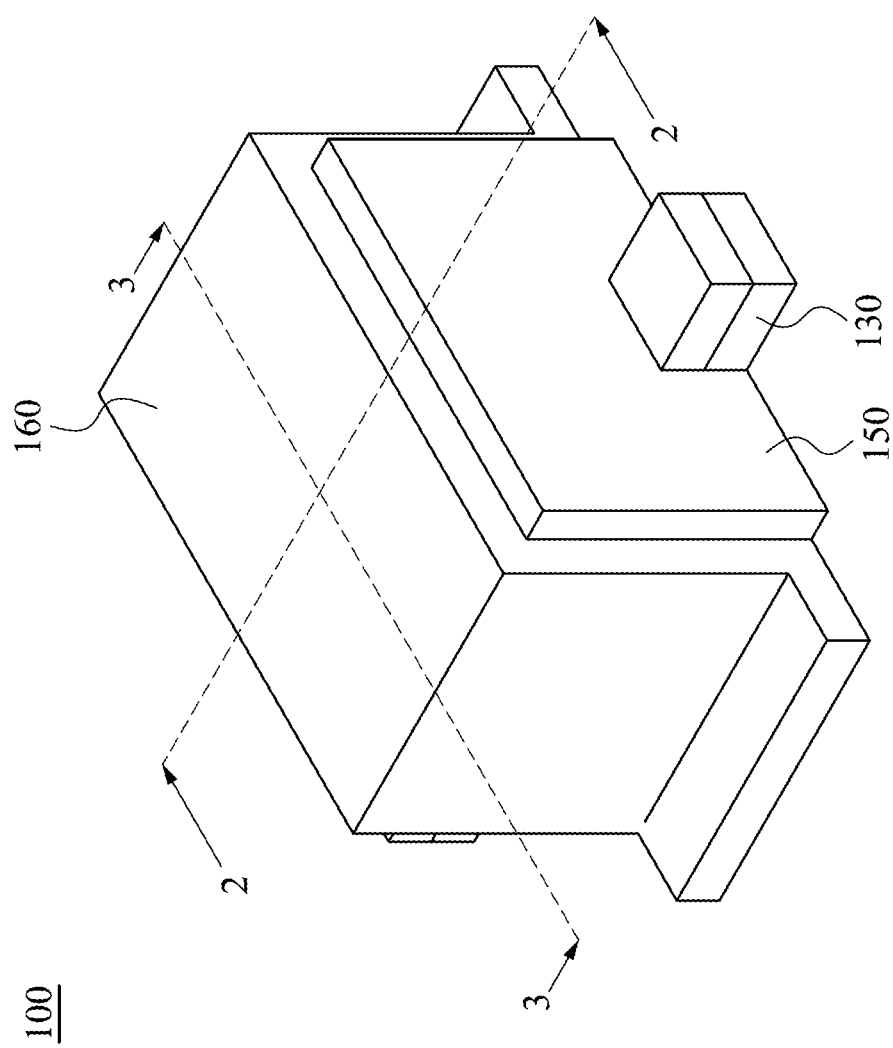
FIG. 1 is a perspective view of an organic thin film transistor according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
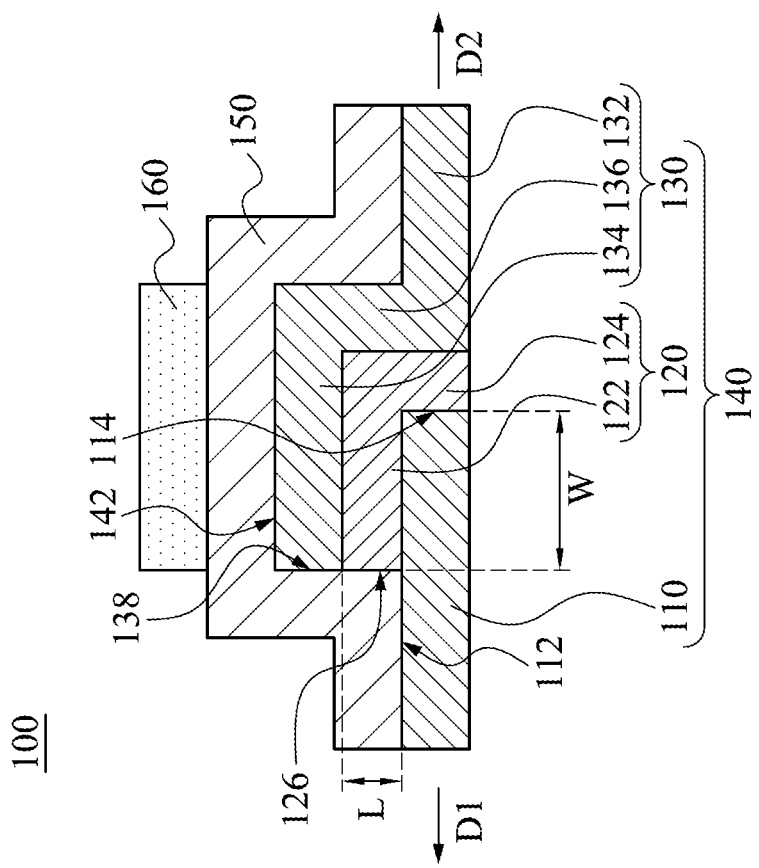
FIG. 2 is a cross-sectional view of the organic thin film transistor taken along line 2-2 shown in FIG. 1.

FIG. 1 is a perspective view of an organic thin film transistor 100 according to one embodiment of the present invention. FIG. 2 is a cross-sectional view of the organic thin film transistor 100 taken along line 2-2 shown in FIG. 1. As shown in FIG. 1 and FIG. 2, the organic thin film transistor 100 includes a drain electrode 110, a semiconductor layer 120, a source electrode 130, a gate insulator 150, and a gate electrode 160. The drain electrode 110 has a top surface 112 and an end surface 114 that is adjacent to the top surface 112. The semiconductor layer 120 has a horizontal portion 122 and a vertical portion 124 that is adjacent to the horizontal portion 122, and the horizontal portion 122 and the vertical portion 124 of the semiconductor layer 120 are respectively located on the top surface 112 and the end surface 114 of the drain electrode 110, such that the semiconductor layer 120 has an L-shaped cross section, as illustrated in FIG. 2. Furthermore, the drain electrode 110 protrudes from the horizontal portion 122 of the semiconductor layer 120 in a first direction D1 that is away from the vertical portion 124 of the semiconductor layer 120.

The source electrode 130 is disposed along a surface of the semiconductor layer 120 facing away from the drain electrode 110, such that the semiconductor layer 120 is located between the source electrode 130 and the drain electrode 110. The source electrode 130 has an extending portion 132 that extends in a second direction D2 opposite to the first direction D1. Moreover, the drain electrode 110, the semiconductor layer 120, and the source electrode 130 may define a stacked structure 140. In this embodiment, the semiconductor layer 120 may be made of organic polymers, the source electrode 130, the drain electrode 110, and the gate electrode 160 may be made of silver, and the gate insulator 150 may be made of organic materials, but the present invention is not limited in these regard. The stacked structure 140 and the gate electrode 160 may be formed by printing or photolithography that may include an exposure process, a development process, and an etching process. The gate insulator 150 may be formed by printing or coating.

Figure 3:
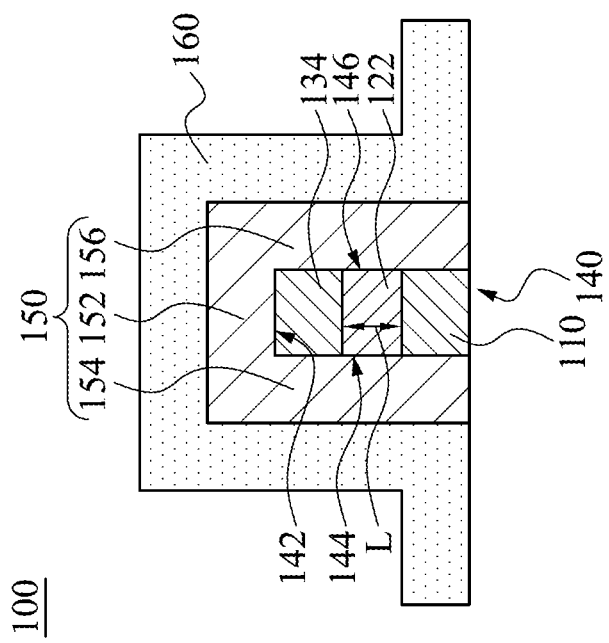
FIG. 3 is a cross-sectional view of the organic thin film transistor taken along line 3-3 shown in FIG. 1.

FIG. 3 is a cross-sectional view of the organic thin film transistor 100 taken along line 3-3 shown in FIG. 1. As shown in FIG. 2 and FIG. 3, the stacked structure 140 has a top surface 142 and two opposite side surfaces 144, 146 that are adjacent to the top surface 142. The gate insulator 150 covers the stacked structure 140, and at least one portion of the gate insulator 150 is disposed along the top surface 142 and the two side surfaces 144 of the stacked structure 140. The gate electrode 160 is located on the gate insulator 150, such that the portion of the gate insulator 150 is located between the stacked structure 140 and the gate electrode 160.

Specifically, the gate insulator 150 has a top portion 152 and two opposite sidewalls 154 and 156 that are adjacent to the top portion 152, such that the gate insulator 150 has a U-shaped cross section, as illustrated in FIG. 3. The top portion 152 of the gate insulator 150 is located between the gate electrode 160 and a first portion 134 of the source electrode 130, and the stacked structure 140 is located between the two sidewalls 154 and 156 of the gate insulator 150. In addition, as illustrated in FIGS. 2 and 3, two opposite sides of the semiconductor layer 120 are respectively in contact with the drain electrode 110 and the source electrode 130, and another two opposite sides of the semiconductor layer 150 are in contact with the gate insulator 150.

Since the combination of the drain electrode 110, the semiconductor layer 120, and the source electrode 130 is the stacked structure 140, and the gate electrode 160 is disposed on the gate insulator 150 that is on the top surface 142 and the two side surfaces 144 and 146 of the stacked structure 140, the organic thin film transistor 100 may be referred to as a dual gate structure. In the organic thin film transistor 100, the thickness L of the semiconductor layer 120 is the length of a channel, and hence the current of the organic thin film transistor 100 can be increased as long as the source electrode 130 partially overlaps the drain electrode 110. As a result, when the organic thin film transistor 100 is applied in a display device, the space of a pixel area occupied by the organic thin film transistor 100 may be reduced, capacitance may be increased, and parasitic capacitance may be reduced, thereby increasing the display area of the pixel area. The organic thin film transistor 100 with the dual gate structure may prevent ions in a front channel and a back channel from diffusing into the channel, such that the instability caused by the ion diffusion can be overcome. Moreover, the gate electrode 160 of the organic thin film transistor 100 is manufactured by only one lithography process, and is not involved in the manufacturing processes of contact holes that are complicated and cause the source electrode and the drain electrode to be easily oxidized, thereby reducing the complexity of research and production, and the tact time.

As shown in FIG. 2, in this embodiment, the source electrode 130 has the first portion 134, a second portion 136, and the extending portion 132 that are sequentially connected. The first portion 134 is located on the horizontal portion 122 of the semiconductor layer 120, and the second portion 136 is located on the vertical portion 124 of the semiconductor layer 120. The first portion 134 of the source electrode 130 overlaps at least one portion of the drain electrode 110. The first portion 134 of the source electrode 130 is substantially parallel to the extending portion 132, and the second portion 136 is substantially perpendicular to the first portion 134 and the extending portion 132. Therefore, the source electrode 130 has a stepped cross section.

Furthermore, the horizontal portion 122 of the semiconductor layer 120 is located between the first portion 134 of the source electrode 130 and the drain electrode 110. The horizontal portion 122 of the semiconductor layer 120 has an end surface 126 that faces away from the vertical portion 124, the first portion 134 of the source electrode 130 has an end surface 138 that faces away from the second portion 136, and the end surface 126 of the horizontal portion 122 of the semiconductor layer 120 is coplanar with the end surface 138 of the first portion 134 of the source electrode 130. The thickness L of the horizontal portion 122 of the semiconductor layer 120 is smaller than a distance W between the end surface 126 of the horizontal portion 122 and the vertical portion 124. The thickness L of the horizontal portion 122 may be referred to as the length of a channel, and the distance W may be referred to as the width of the channel. The greater the ratio W/L is, the greater current will be. In this embodiment, the thickness L of the horizontal portion 122 is smaller than 100 nm, such as in a range from 10 nm to 100 nm.

It is to be noted that the connection relationships and materials of the aforementioned elements will not be described again. In the following description, a display device including the organic thin film transistor 100 will be described.

Figure 4:
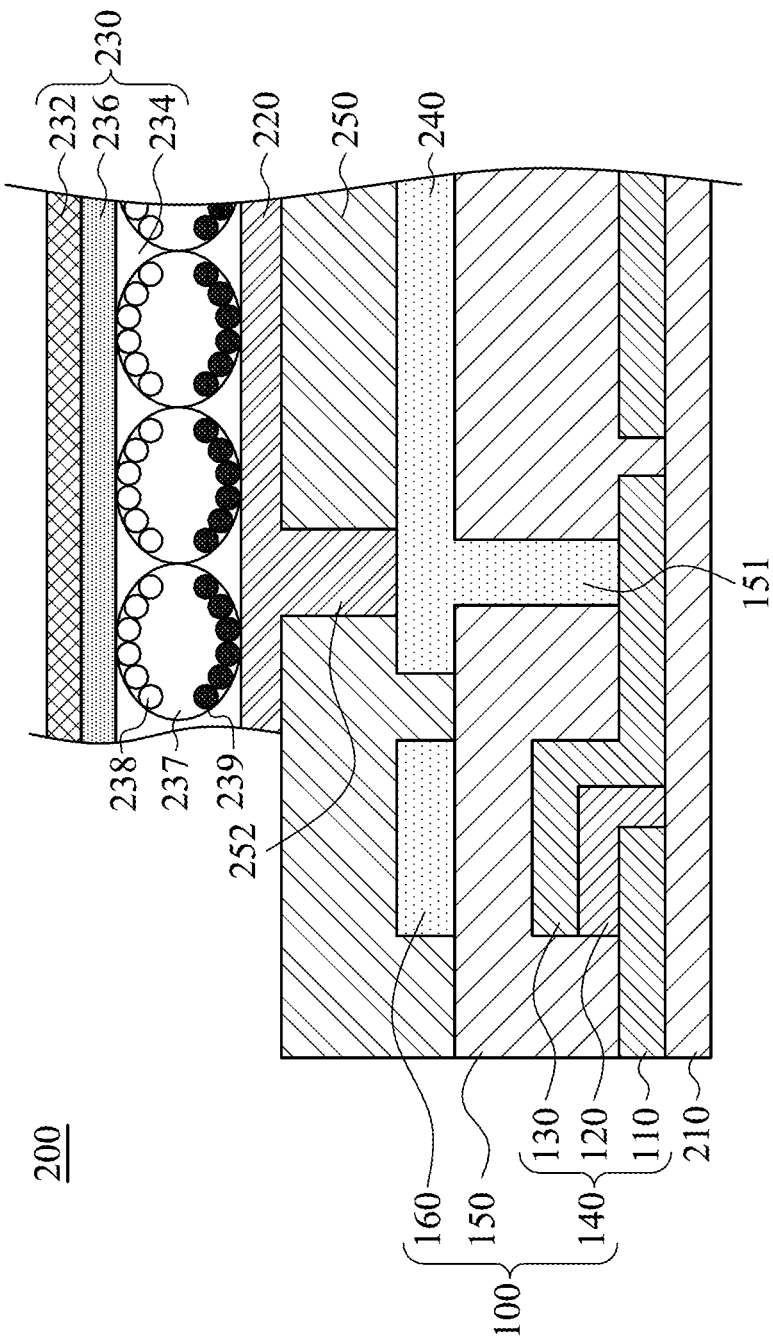
FIG. 4 is a cross-sectional view of an organic thin film transistor applied in a display device according to one embodiment of the present invention.

FIG. 4 is a cross-sectional view of the organic thin film transistor 100 applied in a display device 200 according to one embodiment of the present invention. The display device 200 includes a substrate 210, the aforementioned organic thin film transistor 100, at least one pixel electrode 220, and a front panel laminate 230. The organic thin film transistor 100 is located on the substrate 210 and includes the drain electrode 110, the semiconductor layer 120, the source electrode 130, the gate insulator 150, and the gate electrode 160. The drain electrode 110, the semiconductor layer 120, and the source electrode 130 are located on the substrate 210 and define the stacked structure 140. The pixel electrode 220 is electrically connected to the source electrode 130 of the organic thin film transistor 100. The front panel laminate 230 is located on the pixel electrode 130, and has a light transmissive sheet 232 and a display medium layer 234. The display medium layer 234 is located between the light transmissive sheet 232 and the pixel electrode 220.

Moreover, the gate insulator 150 has a first conductive channel 151 that is electrically connected to the source electrode 130. The display device 200 further includes a conductive layer 240 and a passivation layer 250. The conductive layer 240 is located on the gate insulator 150, and is electrically connected to the first conductive channel 151. The passivation layer 250 covers the organic thin film transistor 100 and the conductive layer 240. The pixel electrode 220 is located on the passivation layer 250. The passivation layer 250 has a second conductive channel 252 that is electrically connected to pixel electrode 220 and the conductive layer 240, and the second conductive channel 252 is substantially aligned with the first conductive channel 151. As a result of such a configuration, the source electrode 130 of the organic thin film transistor 100 may be electrically connected to the pixel electrode 220 through the first conductive channel 151 and the second conductive channel 252.

In this embodiment, the display medium layer 234 has plural microcapsules 237 that have plural color particles therein. In one embodiment, the color particles may be white particles 238 and black particles 239. The front panel laminate 230 further includes a common electrode 236. The common electrode 236 is located on the light transmissive sheet 232 and is opposite the pixel electrode 220, and the microcapsules 237 are located between the common electrode 236 and the pixel electrode 220. The color particles may be driven and moved by an electric field between the common electrode 236 and the pixel electrode 220. For example, when the white particles 238 are at upper positions and the black particles 239 are at lower positions, the display device 200 may display a bright surface. When the black particles 239 are at upper positions and the white particles 238 are at lower positions, the display device 200 may display a dark surface.

The display device 200 is an electronic paper display (EPD). In alternative embodiments, the organic thin film transistor 100 may be applied in other types of display devices, such as a liquid crystal display (LCD).

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. An organic thin film transistor, comprising:
    a drain electrode having a top surface and an end surface that is adjacent to the top surface;
    a semiconductor layer having a horizontal portion and a vertical portion that is adjacent to the horizontal portion, wherein the horizontal portion and the vertical portion are respectively located on the top surface and the end surface of the drain electrode, and the drain electrode protrudes from the horizontal portion of the semiconductor layer in a first direction that is away from the vertical portion of the semiconductor layer;
    a source electrode disposed along a surface of the semiconductor layer facing away from the drain electrode, and having an extending portion that extends in a second direction opposite to the first direction, wherein the drain electrode, the semiconductor layer, and the source electrode define a stacked structure that has a top surface and two opposite side surfaces;
    a gate insulator covering the stacked structure, wherein at least one portion of the gate insulator is disposed along the top surface and the two side surfaces of the stacked structure, and
    a gate electrode located on the gate insulator, such that a portion of the gate insulator is located between the stacked structure and the gate electrode, wherein the gate electrode has a bottom surface lower than the top surface of the drain electrode.

2. The organic thin film transistor of claim 1, wherein the semiconductor layer has an L-shaped cross section.

3. The organic thin film transistor of claim 1, wherein the source electrode has a first portion, a second portion, and the extending portion that are sequentially connected, the first portion is located on the horizontal portion of the semiconductor layer, and the second portion is located on the vertical portion of the semiconductor layer.

4. The organic thin film transistor of claim 3, wherein the first portion is substantially parallel to the extending portion, and the second portion is substantially perpendicular to the first portion and the extending portion.

5. The organic thin film transistor of claim 3, wherein the horizontal portion of the semiconductor layer has an end surface, and the end surface of the horizontal portion is coplanar with an end surface of the first portion of the source electrode.

6. The organic thin film transistor of claim 3, wherein the horizontal portion of the semiconductor layer is located between the first portion of the source electrode and the drain electrode.

7. The organic thin film transistor of claim 3, wherein the gate insulator has a top portion and two opposite sidewalls, the top portion of the gate insulator is located between the gate electrode and the first portion of the source electrode, and the stacked structure is located between the two sidewalls of the gate insulator.

8. The organic thin film transistor of claim 3, wherein the first portion of the source electrode overlaps at least one portion of the drain electrode.

9. The organic thin film transistor of claim 1, wherein the source electrode has a stepped cross section.

10. The organic thin film transistor of claim 1, wherein the gate insulator has a U-shaped cross section.

11. The organic thin film transistor of claim 1, wherein the horizontal portion of the semiconductor layer has an end surface that faces away from the vertical portion, and a thickness of the horizontal portion of the semiconductor layer is smaller than a distance between the end surface of the horizontal portion and the vertical portion.

12. The organic thin film transistor of claim 11, wherein the thickness of the horizontal portion is in a range from 10 nm to 100 nm.

13. The organic thin film transistor of claim 1, wherein two opposite sides of the semiconductor layer are respectively in contact with the drain electrode and the source electrode, and another two opposite sides of the semiconductor layer are in contact with the gate insulator.

14. A display device, comprising:
    a substrate;
    at least one organic thin film transistor located on the substrate and comprising:
        a drain electrode located on the substrate and having a top surface and an end surface that is adjacent to the top surface;
        a semiconductor layer located on the substrate and having a horizontal portion and a vertical portion that is adjacent to the horizontal portion, wherein the horizontal portion and the vertical portion are respectively located on the top surface and the end surface of the drain electrode, and the drain electrode protrudes from the horizontal portion of the semiconductor layer in a first direction that is away from the vertical portion of the semiconductor layer;
        a source electrode located on the substrate and disposed along a surface of the semiconductor layer facing away from the drain electrode, and having an extending portion that extends in a second direction opposite to the first direction, wherein the drain electrode, the semiconductor layer, and the source electrode define a stacked structure that has a top surface and two opposite side surfaces;
        a gate insulator covering the stacked structure, wherein at least one portion of the gate insulator is disposed along the top surface and the two side surfaces of the stacked structure, and
        a gate electrode located on the gate insulator, such that a portion of the gate insulator is located between the stacked structure and the gate electrode, wherein the gate electrode has a bottom surface lower than the top surface of the drain electrode;
    at least one pixel electrode electrically connected to the source electrode of the organic thin film transistor; and a front panel laminate located on the pixel electrode and having a light transmissive sheet and a display medium layer, wherein the display medium layer is located between the light transmissive sheet and the pixel electrode.

15. The display device of claim 14, wherein the gate insulator has a first conductive channel electrically connected to the source electrode, and the display device further comprises:
   a conductive layer located on the gate insulator and electrically connected to the first conductive channel.

16. The display device of claim 15, further comprising:
   a passivation layer covering the organic thin film transistor and the conductive layer.

17. The display device of claim 16, wherein the pixel electrode is located on the passivation layer, and the passivation layer has a second conductive channel electrically connected to pixel electrode and the conductive layer.

18. The display device of claim 17, wherein the second conductive channel is aligned with the first conductive channel.

19. The display device of claim 14, wherein the display medium layer has a plurality of microcapsules, and the front panel laminate further comprises:
   a common electrode located on the light transmissive sheet and opposite the pixel electrode, wherein the microcapsules are located between the common electrode and the pixel electrode.

* * * * *